United States Patent
Amirmazlaghani et al.

(10) Patent No.: US 10,121,926 B2
(45) Date of Patent: Nov. 6, 2018

(54) GRAPHENE-BASED DETECTOR FOR W-BAND AND TERAHERTZ RADIATIONS

(71) Applicants: Mina Amirmazlaghani, Tehran (IR); Farshid Raissi, Tehran (IR)

(72) Inventors: Mina Amirmazlaghani, Tehran (IR); Farshid Raissi, Tehran (IR)

(73) Assignees: Shahid Rajaee Teacher Training University, Tehran (IR); Mina Amirmazlaghani, Tehran (IR); Farshid Raissi, Tehran (IR)

(*) Notice: Subject to any disclaimer, the term of this patent is extended or adjusted under 35 U.S.C. 154(b) by 0 days.

(21) Appl. No.: 15/682,443

(22) Filed: Aug. 21, 2017

(65) Prior Publication Data
US 2018/0053871 A1    Feb. 22, 2018

Related U.S. Application Data

(60) Provisional application No. 62/377,820, filed on Aug. 22, 2016.

(51) Int. Cl.
*H01L 31/0224* (2006.01)
*H01L 31/028* (2006.01)
(Continued)

(52) U.S. Cl.
CPC ...... *H01L 31/1013* (2013.01); *H01L 27/1446* (2013.01); *H01L 31/028* (2013.01); *H01L 31/022408* (2013.01); *H01L 31/108* (2013.01)

(58) Field of Classification Search
CPC ......... H01L 27/1446; H01L 31/022408; H01L 31/028; H01L 31/1013; H01L 31/108
See application file for complete search history.

(56) References Cited

U.S. PATENT DOCUMENTS 7,947,955 B2    5/2011    Riken
9,016,108 B1    4/2015    Miranda et al.
(Continued)

FOREIGN PATENT DOCUMENTS

CN    104916732 A    9/2015
CN    104393093 B    2/2017
(Continued)

OTHER PUBLICATIONS

Mina Amirmazlaghani, Graphene-Si Schottky IR Detector, IEEE Journal of Quantum Electronics, Jul. 2013, vol. 49, No. 7, pp. 589-594.
(Continued)

*Primary Examiner* — Mark R Gaworecki
(74) *Attorney, Agent, or Firm* — NovoTechIP International PLLC

(57) ABSTRACT

A method for detecting W-band and terahertz radiations is disclosed. The method provides a graphene-Si Schottky diode that includes a graphene monolayer having an Ohmic contact with a source electrode supported on a top surface of a doped silicon substrate by an insulating layer, and extends over an edge of the source electrode and contacts the top surface, in a manner forming a Schottky junction. The method stores reference current-voltage (I-V) characteristics of the Schottky junction in a reverse biased mode, then measures I-V characteristics of the Schottky junction in the reverse biased mode, and detects W-band and terahertz radiation by comparing the measured I-V characteristics of the Schottky junction to the stored reference I-V characteristics.

19 Claims, 11 Drawing Sheets

(51) Int. Cl.
  *H01L 27/144* (2006.01)
  *H01L 31/101* (2006.01)
  *H01L 31/108* (2006.01)

(56) References Cited

U.S. PATENT DOCUMENTS

| | | | |
|---|---|---|---|
| 9,130,082 B2 | 9/2015 | Park | |
| 9,453,811 B2 | 9/2016 | Duesberg | |
| 9,627,562 B2* | 4/2017 | Zhang | B82Y 40/00 |
| 9,993,982 B2* | 6/2018 | Sherrer | B29C 70/882 |
| 2007/0181909 A1* | 8/2007 | Rozsypal | H01L 29/872 257/109 |
| 2014/0001363 A1* | 1/2014 | Koyama | H01L 29/872 250/338.4 |
| 2017/0148928 A1* | 5/2017 | Koyama | H01L 29/872 |

FOREIGN PATENT DOCUMENTS

| | | |
|---|---|---|
| WO | 2016042340 A1 | 3/2016 |
| WO | 2016140946 A1 | 9/2016 |

OTHER PUBLICATIONS

Fereshteh Ghahramani, Evaluation of Photodetection Properties of Graphene-Silicon Schottky IR Detector, International Journal of Green Nanotechnology, 2012, vol. 4, Issue 4, pp. 464-469.
Chun-Chung Chen, Graphene-silicon Schottky diodes, Nano letters, 2011, vol. 11, Issue 5, pp. 1863-1867.
Weifeng Jin, Self-powered high performance photodetectors based on CdSe nanobelt/graphene Schottky junctions, ournal of Materials Chemistry, 2012, vol. 22, Issue 7, pp. 2863-2867.
Kun Xu, Graphene GaN-based schottky ultraviolet detectors, IEEE Transactions on Electron Devices, 2015, vol. 62, Issue 9, pp. 2802-2808.
Antonio Di Bartolomeo, Tunable Schottky barrier and high responsivity in graphene/Si-nanotip optoelectronic device, 2D Materials, 2016, vol. 4, Issue 1, 015024.
Mircea Dragoman, Millimeterwave Schottky diode on grapene monolayer via asymmetric metal contacts, Journal of Applied Physics, 2012, vol. 112, Issue 8, 084302.
Muatez Mohammed, Junction investigation of graphene/silicon Schottky diodes, Nanoscale research letters, 2012, vol. 7, Issue 1, p. 302.
Haijian Zhong, Charge transport mechanisms of graphene/semiconductor Schottky barriers: A theoretical and experimental study, Journal of Applied Physics, 2014, vol. 115, Issue 1, 013701.
D. Tomer, Inhomogeneity in barrier height at graphene/Si (GaAs) Schottky junctions, Nanotechnology, 2015, vol. 26, Issue 21, 215702.
L. Vicarelli, Graphene field effect transistors as room-temperature Terahertz detectors, arXiv preprint arXiv, 2012, 1203.3232.
V. Ryzhii, Graphene vertical hot-electron terahertz detectors, Journal of Applied Physics, 2014, vol. 116, Issue 11, p. 114504.
Xinghan Cai, Sensitive room-temperature terahertz detection via the photothermoelectric effect in graphene, Nature nanotechnology, 2014, Volue 9, Issue 10, pp. 814-819.
Martin Mittendorff, Ultrafast graphene-based broadband THz detector, Applied Physics Letters, 2013, vol. 103, Issue 2, 021113.
F. H. L. Koppens, Photodetectors based on graphene, other two-dimensional materials and hybrid systems, Nature nanotechnology, 2014, vol. 9, Issue 10, pp. 780-793.
Lin Wang, Intrinsic photo-conductance triggered by the plasmonic effect in graphene for terahertz detection, Nanotechnology, 2015, vol. 27, Issue 3, 035205.

* cited by examiner

GRAPHENE-BASED DETECTOR FOR W-BAND AND TERAHERTZ RADIATIONS

CROSS-REFERENCE TO RELATED APPLICATION

This application claims the benefit of priority from pending U.S. Provisional Patent Application Ser. No. 62/377,820, filed on Aug. 22, 2016, and entitled "A GRAPHENE-BASED W-BAND AND THZ DETECTOR," which is incorporated herein by reference in its entirety.

TECHNICAL FIELD

The present disclosure generally relates to radiation detectors, and particularly to a graphene-based detector for detecting W-band and terahertz radiations.

BACKGROUND

Graphene is a two-dimensional material with remarkable optical, thermal, and electrical properties. Graphene is a single-atom layer that can absorb incident light rays in a broad band range of frequencies through interband and intraband transitions. The interband transitions dominate infrared (IR) and visible light absorption, while intraband transitions govern terahertz (THz) detection. Based on the interband and intraband transitions, different types of graphene-based detectors may be developed that are capable of working at different wavelengths.

Graphene is capable of detecting W-band of the microwave part of the electromagnetic spectrum and THz radiation at room temperature. W-band ranges from 75 to 200 GHz and THz radiation includes electromagnetic waves within a band of frequencies from 0.1 THz to 10 THz. THz radiation occupies a range of electromagnetic spectrum between microwaves and infrared light waves, which is known as the THz gap. The frequency of electromagnetic radiation in the THz gap becomes too high to be measured digitally via conventional electronic counters.

Different devices have been developed that take advantage of peculiar photo detection properties of graphene in W-band and THz regions. For example, graphene field effect transistors (FETs), graphene P-I-N junctions, plasmonic graphene-nanoribbon FETs, graphene-THz modulators, and zero-bias graphene-FETs are among the devices developed for detecting W-band and THz radiations at room temperature.

Although these graphene devices are capable of working at room temperature, technical issues include considerably lower efficiency than conventional cooled bolometers. In addition, such devices structures are relatively complex. For example, graphene-FETs have been used as THz detectors, but their structures are complex and their manufacturing process involves costly electron beam lithography. Other technical issues with conventional graphene-based THz detector devices include small effective photo detection area and short carrier life time.

There is therefore a need in the art for simple and cost effective graphene-based detectors that are capable of working at room temperature with an efficiency equal or higher than conventional superconductor-based detectors, such as cooled bolometers. There is a further need in the art for graphene-based detectors that are manufactured through simple manufacturing processes.

SUMMARY

This summary is intended to provide an overview of the subject matter of this patent, and is not intended to identify essential elements or key elements of the subject matter, nor is it intended to be used to determine the scope of the claims. The proper scope of this patent may be ascertained from the appended claims in view of the detailed description below and the drawings.

In one general aspect, the present disclosure is directed to a method for detecting W-band and terahertz radiations. The method may include providing a doped silicon substrate including a first surface and a second surface, where an insulating layer may be disposed on the first surface of the doped silicon substrate and a source electrode may be formed on the insulating layer. Furthermore, a drain electrode may be formed on the second surface of the doped silicon substrate and at least one layer of graphene is formed on a top surface of the source electrode and extending over an edge of the source electrode and contacting the doped silicon substrate thereby forming a Schottky junction with the doped silicon substrate. The method may further include measuring current-voltage (I-V) characteristics of the Schottky junction; and comparing the measured I-V characteristics of the Schottky junction with reference I-V characteristics of the Schottky junction in order to detect W-band and terahertz radiations.

According to one implementation, the reference I-V characteristics of the Schottky junction may be I-V characteristics of the Schottky junction when the Schottky junction is not exposed to any W-band and terahertz radiations.

According to one implementation, measuring I-V characteristics of the Schottky junction may include coupling a power source with the source electrode and the drain electrode to apply at least one voltage between the source electrode and the drain electrode, and measuring a current generated between the source electrode and the drain electrode for the at least one voltage.

According to some implementations, W-band and terahertz radiations may be detected when I-V characteristics of the Schottky junction are different from the reference I-V characteristics of the Schottky junction.

According to some implementations, the doped silicon substrate can include a p-type silicon substrate with a resistivity of 25-35Ω cm, the insulating layer may include a $SiO_2$ layer, the source electrode may include an Au layer, and the drain electrode may include an Al layer.

According to another general aspect, the present disclosure is directed to a system for detecting W-band and terahertz radiations. The system may include: a graphene-Si Schottky diode associated with a source electrode and a drain electrode; a power source coupled with the source electrode and the drain electrode in order to apply a base voltage between the source electrode and the drain electrode; a measurement instrument configured to measure a generated current between the source electrode and the drain electrode; and a processing unit configured to compare the measured current with a reference current, wherein the W-band and terahertz radiations are detected based on the comparison.

According to one implementation, the reference current may be a current generated between the source electrode and the drain electrode when the graphene-Si Schottky diode is biased in a reverse mode and not exposed to W-band and terahertz radiations.

BRIEF DESCRIPTION OF THE DRAWINGS

The drawing figures depict one or more implementations in accord with the present teachings, by way of example

DETAILED DESCRIPTION

Figure 1:
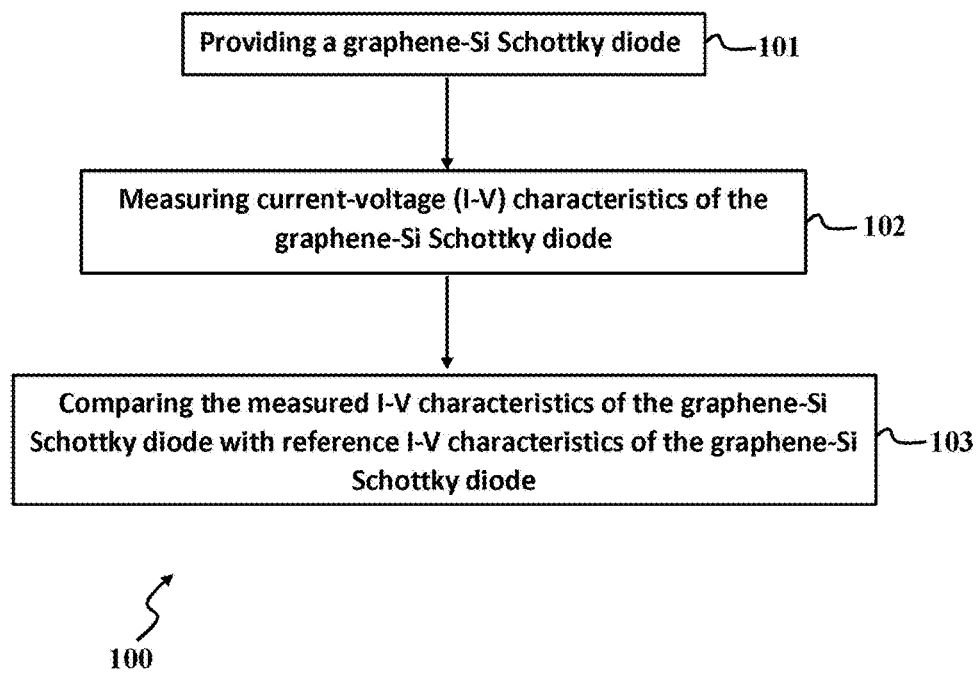
FIG. 1 illustrates an implementation of a method for detecting W-band and terahertz radiations, according to one or more aspects of the present disclosure.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

A Schottky diode is a semiconductor diode with a low forward voltage drop and a very fast switching action. A normal diode will have a voltage drop between 0.6 to 1.7 volts when current flows through the diode, while a Schottky diode may have a voltage drop between 0.15 and 0.45 volts. This lower voltage drop provides better system efficiency and higher switching speed. In a Schottky diode, a semiconductor-metal junction is formed between a semiconductor and a metal, thus creating a Schottky barrier. Schottky barriers have rectifying characteristics, suitable for use as a diode. The Schottky barrier between the metal and the semiconductor depends on and is proportional to the difference of the metal-vacuum work function and the semiconductor-vacuum electron affinity. Conducting properties of semiconductors may be altered by deliberate, controlled introduction of impurities (i.e., doping) into the crystal structure. Doping greatly increases the number of charge carriers within the crystal. When a doped semiconductor contains mostly free holes it is called "p-type," and when it contains mostly free electrons it is known as "n-type."

In order to pass the Schottky barrier, an amount of energy equal to the difference between the metal-vacuum work function and the semiconductor-vacuum electron affinity should be transferred to either electrons (for an n-type semiconductor), or to holes (for a p-type semiconductor). An electromagnetic radiation on the Schottky diode may provide the charge carriers with enough energy to pass the barrier, which in turn changes the current-voltage characteristic curve of the Schottky diode. This phenomenon may be utilized in detecting W-band and THz radiations by Schottky diodes.

Systems and methods for detecting W-band and THz radiations by a graphene-based detector, and particularly systems and methods for detecting W-band and THz radiations that take advantage of photocurrent generation properties of a Schottky diode are disclosed. As provided herein, according to an implementation, a graphene-Si Schottky diode is fabricated and utilized as a W-band and THz detector. The graphene-Si Schottky diode is alternatively referred to herein as a graphene-Si Schottky detector. The graphene-Si Schottky detector may provide a larger photo detection area, in which the effective photo detection area is limited only by the size of graphene monolayer. Fast collecting behavior of the graphene-Si Schottky detector combined with a large photo detection area can improve over small effective photo detection area and short carrier life time issues with previous graphene-based detectors, such as graphene-FETs and metal-graphene-metal detectors. In addition, the graphene-Si Schottky detector can be fabricated without introduction of costly steps in the fabrication process. This can provide a low cost and low complexity process to fabricate W-band and THz detectors with enhanced performance.

FIG. 1 illustrates a flow 100 in a process of a method 100 for detecting W-band and terahertz radiations, according to one or more aspects of the present disclosure. An instance of the flow 100 can proceed from an arbitrary start 100 to 101, at which operations can be applied for providing a graphene-Si Schottky diode. The flow 100 can then proceed to 102 and apply operations of measuring current-voltage (I-V) characteristics of the graphene-Si Schottky diode, and comparing the measured I-V characteristics of the graphene-Si Schottky diode with reference I-V characteristics of the graphene-Si Schottky diode.

Referring to FIG. 1, in one implementation, operations at 101 may include providing a graphene-Si Schottky diode that includes a Schottky junction between at least one monolayer of graphene and a doped silicon substrate, examples of which will be described in detail later in this disclosure. The flow 100 can then proceed to 102 and apply operations of measuring current-voltage (I-V) characteristics of the graphene-Si Schottky diode in a reverse biased mode. Operations at 102 can include associating the graphene-Si Schottky diode with a source electrode and a drain electrode and then applying a series of electrical potential differences between the source electrode and the drain electrode, for example, by a power source and measuring a current generated in the graphene-Si Schottky diode for each applied electrical potential difference.

Referring to FIG. 1, according to one implementation, the flow 100 can then proceed to 103 and apply operations of comparing the measured I-V characteristics of the graphene-Si Schottky diode in a reverse biased mode to reference I-V characteristics of the graphene-Si Schottky diode. The reference I-V characteristics of the graphene-Si Schottky diode may be obtained, for example, previously, by measurements applied when the graphene-Si Schottky diode is biased in a reverse mode and not exposed to any W-band and terahertz radiations.

Figure 2A:
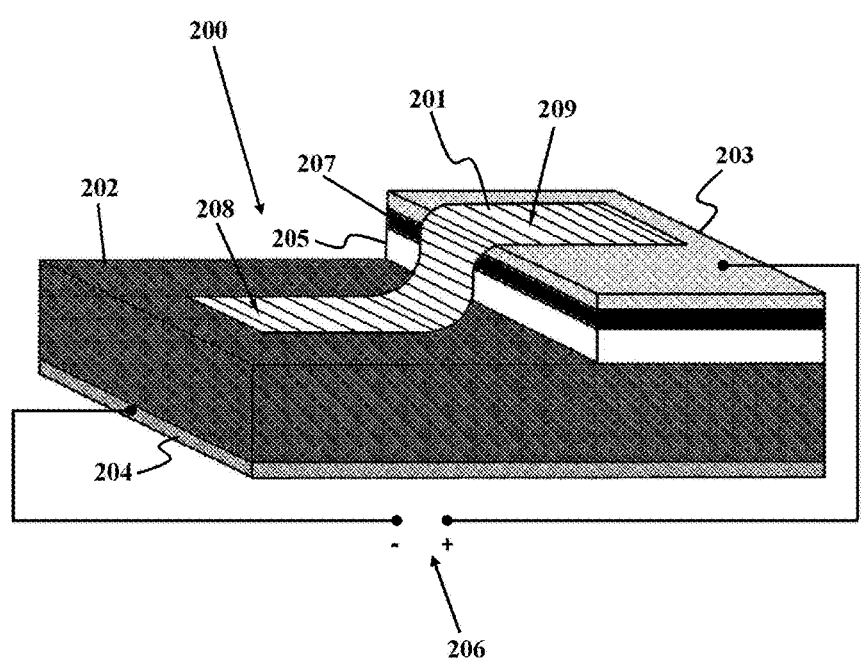
FIG. 2A illustrates an implementation of a graphene-Si Schottky diode that may be utilized in a graphene-Si Schottky detector, according to one or more aspects of the present disclosure.

FIG. 2A illustrates an implementation of a graphene-Si Schottky diode 200 that may be utilized in a graphene-Si Schottky detector, according to one or more aspects of the present disclosure. Referring to FIG. 2A, the graphene-Si Schottky diode 200 may include a graphene monolayer 201. A first portion 208 of the graphene monolayer 201 may be deposited on a surface of a semiconductor 202, such as a doped silicon substrate, to establish a Schottky contact. The graphene-Si Schottky diode 200 may further be associated with a source electrode 203, for example, a gold (Au) layer, a drain electrode 204, for example, an aluminum (Al) layer, an insulator 205, for example, a $SiO_2$ layer, and a power supply 206. A second portion 209 of the graphene monolayer 201 may be deposited on a surface of the source electrode 203 to establish an Ohmic contact between the source electrode 203 and the graphene monolayer 201. In other words, the graphene monolayer 201 may be formed on a top surface of the source electrode 203, where the graphene monolayer 201 extends over an edge of the source electrode 203 and contacts the semiconductor 202.

The drain electrode 204 may have an Ohmic contact with the semiconductor 202. The power supply 206 may be connected to the source electrode 203 and the drain electrode 204, which can enable application of a voltage between the source electrode 203 and the drain electrode 204. An insulator 205 can separates the source electrode 203 from the semiconductor 202 to ensure that the contact between the semiconductor 202 and the source electrode 203 is through the Schottky contact between the graphene monolayer 201 and the semiconductor 202. According to an implementation, a titanium (Ti) layer 207 may be used as a bonding layer between the source electrode 203 and the insulator 205.

Figure 2B:
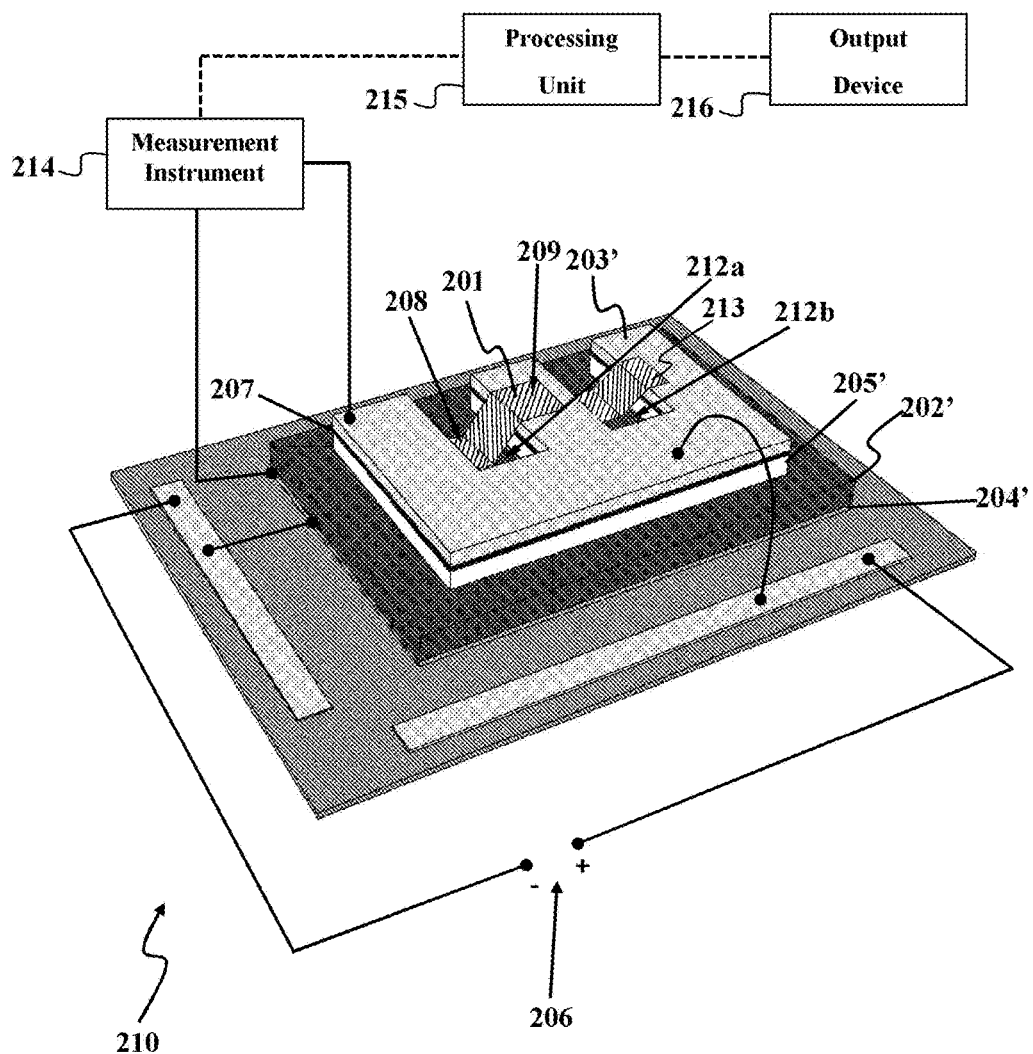
FIG. 2B illustrates a schematic representation of an implementation of graphene-Si Schottky detector, according to one or more aspects of the present disclosure.

FIG. 2B illustrates a schematic representation of an implementation of graphene-Si Schottky detector 210 that may be configured to be an exemplary embodiment of the method 100 of FIG. 1. The graphene-Si Schottky detector 210 may include a graphene-Si Schottky diode similar to the graphene-Si Schottky diode 200 of FIG. 2A. Referring to FIGS. 2A and 2B, the source electrode 203 may be an Au layer 203', the insulator 205 may be an $SiO_2$ layer 205', the semiconductor 202 may be a p-type or an n-type doped silicon substrate 202', and the drain electrode 204 may be an Al layer 204'. The Au layer 203', the Ti layer 207, and the $SiO_2$ layer 205' may be patterned to create windows 212a-b that may be used for deposition of the graphene monolayer 201. The windows 212a-b may be shaped to allow for deposition of graphene monolayers, such that a first portion (e.g., first portion 208) of each graphene monolayer may be deposited on the Au layer 203' and a second portion (e.g., second portion 209) of each graphene monolayer may be deposited on the doped silicon substrate 202'. For example, the graphene monolayer 201 can be deposited in the window 212a, such that its first portion 208 is deposited on the doped silicon substrate 202' and its second portion 209 deposited on the Au layer 203'. In another implementation, a second graphene monolayer 213 may be similarly deposited in window 212b.

In one implementation, the power supply 206 may be a current source that is wire bonded to the Au layer 203' and the Al layer 204' to generate an electric current in the graphene-Si Schottky detector 210 in the reverse biased mode. The Au layer 203' and the Al layer 204' that function as the source electrode and the drain electrode of the graphene-Si Schottky detector 210, respectively, may be connected to a measurement instrument 214. The measurement instrument 214 may be a voltmeter, for measuring the electrical potential difference between the Au layer 203' and the Al layer 204'. A base or reference measurement can be performed, for example, by applying a base or reference current from the power supply 206, and measuring a corresponding base or reference electrical potential difference between the Au layer 203' and the Al layer 204' in a first instance where no W-band or terahertz radiations are radiated onto the graphene monolayers (such as graphene monolayer 201 and graphene monolayer 213). Next, while the graphene monolayers are exposed to a W-band or a terahertz radiation, the same base or reference current may be applied by the power supply 206, and a specific electrical potential difference measured between the Au layer 203' and the Al layer 204'. The measured voltage in the second instance will be different from the reference electrical potential difference that was measured between the Au layer 203' and the Al layer 204' in the first instance. The specific electrical potential difference between the Au layer 203' and the Al layer 204' in the second instance is proportional to a power of the W-band or the terahertz radiation onto the graphene monolayers.

In another implementation, the power supply 206 may be a voltage source that is wire bonded to the Au layer 203' and the Al layer 204' to apply an electrical potential difference between the Au layer 203' and the Al layer 204' as the electrodes of the graphene-Si Schottky detector 210. The Au layer 203' and the Al layer 204' that function as the source electrode and the drain electrode of the graphene-Si Schottky detector 210, respectively, may be connected to a measurement instrument 214. The measurement instrument 214 may be an ammeter, for measuring the electric current that is generated between the Au layer 203' and the Al layer 204'. A base or reference electrical potential difference can be applied by the power supply 206, and a corresponding base or reference electric current measured between the Au layer 203' and the Al layer 204' without W-band or terahertz radiations being radiated onto the graphene monolayers (such as graphene monolayer 201 and graphene monolayer 213). The graphene monolayers can then be exposed to a W-band or a terahertz radiation, the same base or reference electrical potential difference can be applied by the power supply 206, and a specific corresponding electric current measured between the Au layer 203' and the Al layer 204'. The electric current measurement in the second instance will be different from the base or reference electric current that was measured between the Au layer 203' and the Al layer 204' in the first instance. The specific electric current between the Au layer 203' and the Al layer 204' in the second instance is proportional to a power of the W-band or the terahertz radiation that was radiated onto the graphene monolayers in the second instance.

With further reference to FIG. 2B, in an implementation, measured electric current or electrical potential difference (herein after "measured value") by the measurement instrument 214 may be sent to a processing unit 215. The processing unit 215 may have a memory and a processor (not explicitly shown in FIG. 2B). The memory may be configured for storing the measured value. The memory may further include a base or reference electric current or electrical potential difference (hereinafter "base value") which is measured for the first instance where the graphene-Si Schottky detector 210 is not exposed to any W-band or terahertz radiation. The memory may further include executable instructions that once executed by the processor, cause the processing unit 215 to calculate the difference between the measured value and the base value to detect the presence of a W-band or a terahertz radiation. The processing unit 215 may be configured to respond to a determination of a difference between the second measured value and the reference value by sending a signal to the output device 216, where the signal indicates that a W-band or a terahertz radiation is detected by the graphene-Si Schottky detector 210. According to an implementation, the processing unit 215 may be calibrated in order to obtain a responsivity value for the graphene-Si Schottky detector 210. This responsivity value shows how the measured current or electrical potential difference are proportional to the power of the radiation that is being radiated on the graphene monolayers of the graphene-Si Schottky detector 210. The processing unit 215 may be configured to utilize the responsivity value in order to convert the difference between the measured value and the base value to a value indicating the amount of radiation power being detected by the graphene-Si Schottky detector 210. The responsivity value may have a unit of volt per watt and it can be obtained by calibrating the graphene-Si Schottky detector 210 by exposing the graphene-Si Schottky detector 210 to various W-band and terahertz radiations with various powers and then measuring the difference between the measured value and the base value for each radiation. The output device 216 may be in the form of an indicator, which may show the amount of radiation power detected by the graphene-Si Schottky detector 210.

Figure 2C:
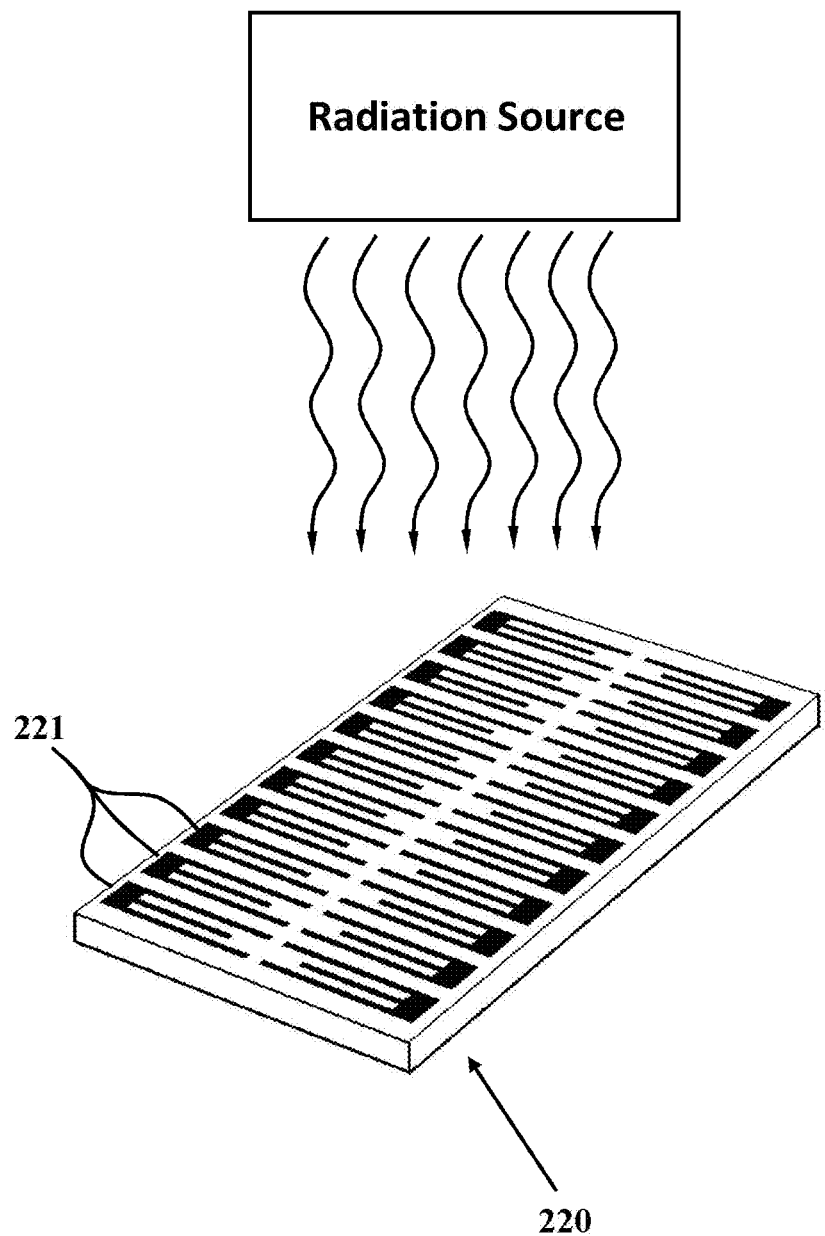
FIG. 2C illustrates an implementation of a graphene-Si Schottky detector array, according to one implementation of the present disclosure.

Referring now to FIG. 2C, according to an aspect of the present disclosure, a graphene-Si Schottky detector array 220 is illustrated. The graphene-Si Schottky detector array 220 may include a plurality of graphene-Si Schottky detectors 221, where each may be structured, for example, according to or similar to the graphene-Si Schottky detector 210 described later in reference to FIG. 2B. The graphene-Si Schottky detectors 221 may be arranged in a two-dimensional array. FIG. 2C is an illustrative example array with a specific number of graphene-Si Schottky detectors 221. The specific number that is illustrated is only one example, and is not intended as a limitation. On the contrary, it will be recognized that other implementations can use a be higher or lower number of graphene-Si Schottky detectors 221 in the graphene-Si Schottky detector array 220, depending on the intended application.

The graphene-Si Schottky detector array 220 may be utilized in a W-band imaging system or in a terahertz imaging system. Each graphene-Si Schottky detector in the graphene-Si Schottky detector array 220 will generate a signal in the form of generated current or voltage once a W-band or terahertz radiation is received by that graphene-Si Schottky detector. The generated signals may be mapped as an image in a W-band or terahertz imaging system.

FIGS. 3A-3E are schematic representations of an example process flow in one implementation of a method for fabricating a graphene-Si Schottky detector, such as the graphene-Si Schottky diode 210 of FIG. 2B. The flow may include slicing a p-type or an n-type doped silicon substrate 301 with a specific doping density. For example, a p-type doped silicon substrate with a resistivity of 1-10Ω cm which is equivalent of a doping density of $1 \times 10^{16}$ cm$^{-3}$. There is a first SiO$_2$ layer 302 on a first side of the doped silicon substrate 301 and there is a second SiO$_2$ layer 303 on a second side of the doped silicon substrate 301. The first SiO$_2$ layer 302 and the second SiO$_2$ layer 303 may have a thickness of about 400 nanometers.

Figure 3A:
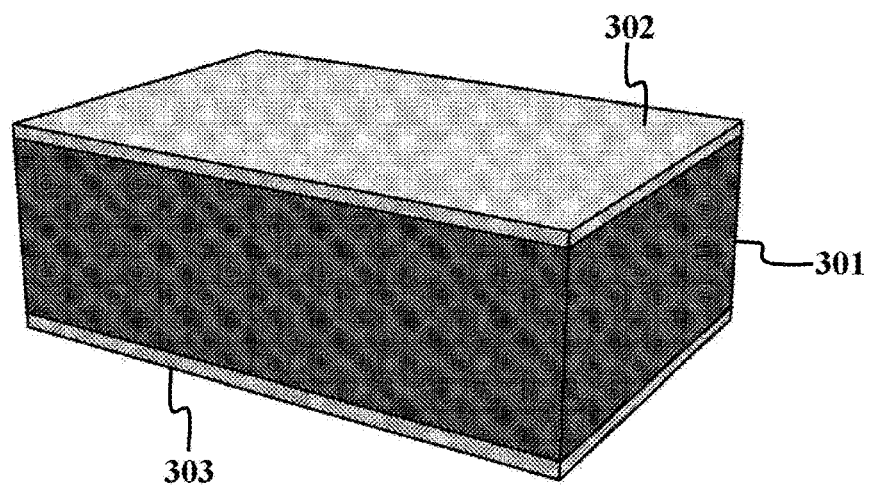
FIGS. 3A-3E are schematic representations of steps of an implementation of a method for fabricating a graphene-Si Schottky detector.
Figure 3B:
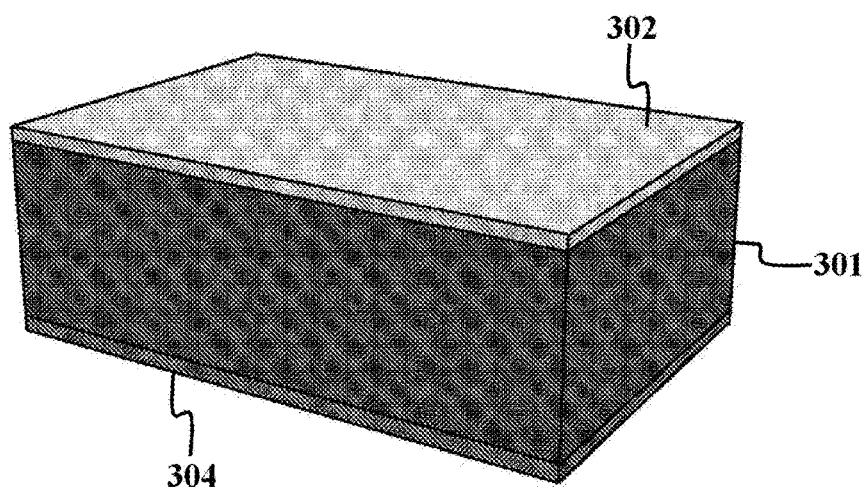

The second SiO$_2$ layer 303 may be removed from the second side of the doped silicon substrate 301 and an aluminum (Al) layer 304 may be deposited on the second side of the doped silicon substrate 301 as shown in FIG. 3B. To this end, the first side of the doped silicon substrate 301 may be covered by a photoresist layer and then the doped silicon substrate 301 may be immersed inside a diluted hydrofluoric acid solution, for a predetermined amount of time, for example, 5 minutes in order to remove the second SiO$_2$ layer 303. The Al layer 304 with a thickness of, for example, 200 nm may be deposited on the second side of the doped silicon substrate 301. The deposition of the AL layer can be by, for example, a chemical vapor deposition method followed by a rapid thermal processing to form an Ohmic drain electrode of the graphene-Si Schottky detector 210 similar to the drain electrode 204 in FIG. 2A and the Al layer 204' in FIG. 2B.

Figure 3C:
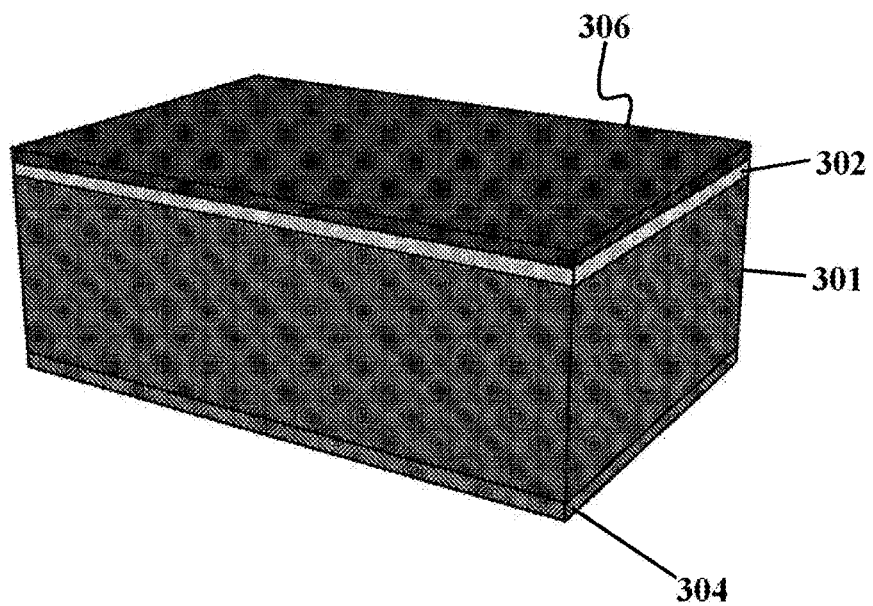
Figure 3D:
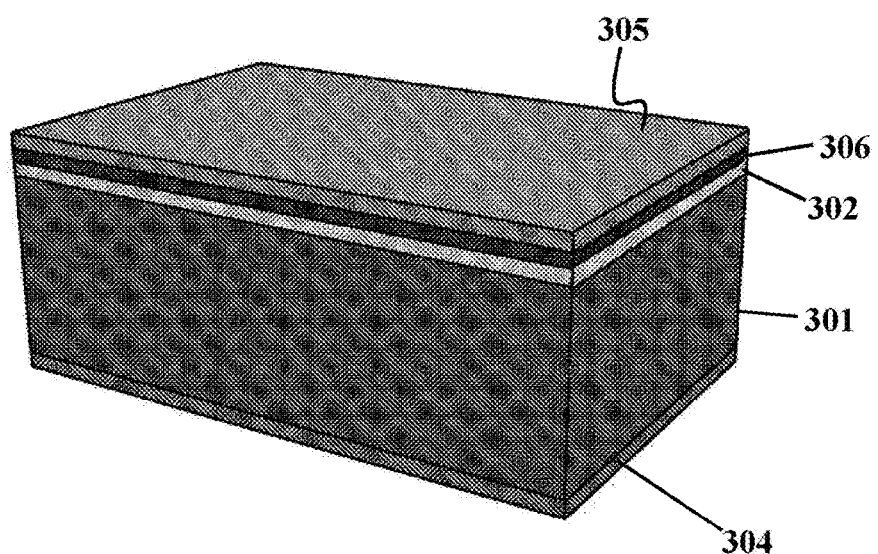

Referring to FIGS. 3C and 3D, an Au layer 305 may be deposited on the first SiO$_2$ layer 302 to form a source electrode of the graphene-Si Schottky detector 210 similar to the source electrode 203 in FIG. 2A and the Au layer 203' in FIG. 2B. To this end, Au is deposited on the first SiO$_2$ layer 302. The first SiO$_2$ layer 302 functions as an insulator to prevent a direct contact between the Au layer 305 and doped silicon substrate 301. According to an implementation, a titanium (Ti) layer 306 may be used as an adhesive layer between the Au layer 305 and the first SiO$_2$ layer 302.

Figure 3E:
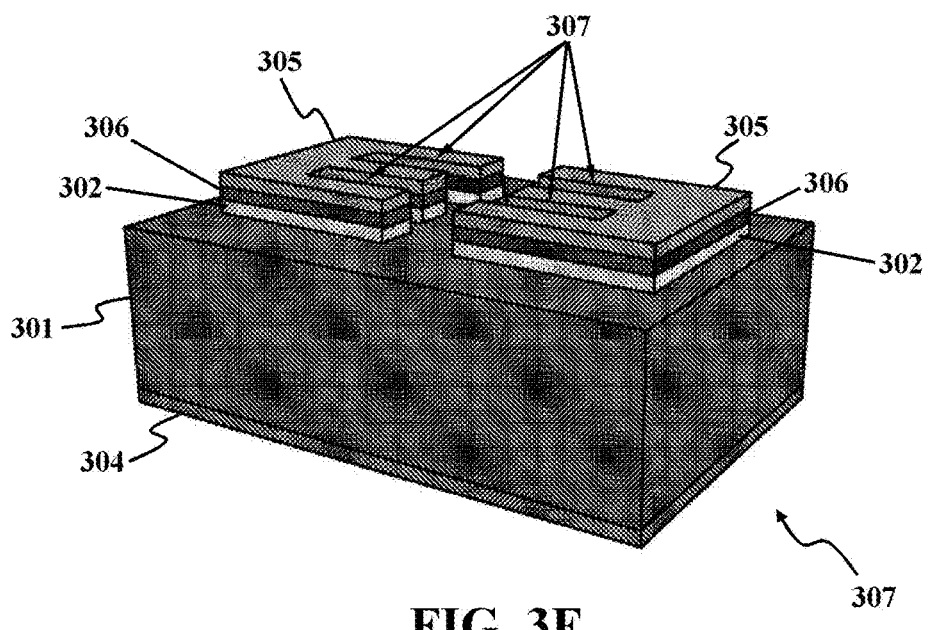

Referring to FIG. 3E, the Au layer 305, the Ti layer 306, and the first SiO$_2$ layer 302 may be patterned to create windows similar to the windows 212a-b in FIG. 2B. In an implementation, a photolithography process may be utilized to pattern the Au layer 305, the Ti layer 306, and the first SiO$_2$ layer 302. A photoresist layer is first coated on a surface of the Au layer 305 by, for example, a spin coating process, then a mask with a desired geometrical pattern is utilized for carrying out the photolithography. A developing process is then applied to remove the excess photoresist layer and form a photoresist layer with the desired pattern on the Au layer 305. An etching process may be carried out to etch the desired pattern on the Au layer 305, the Ti layer 306, and the first SiO$_2$ layer 302. According to some implementations, either a wet etching process or a dry etching process may be utilized to create the pattern on the Au layer 305, the Ti layer 306, and the first SiO$_2$ layer 302. According to an implementation, a dry etching process, such as ion beam milling may be utilized to create the desired pattern onto the Au layer 305, the Ti layer 306, and the first SiO$_2$ layer 302 and thereby creating windows 307 that may be shaped to function as the windows 212a-b of FIG. 2B. The photoresist layer may then be removed from the surface of the now patterned Au layer 305.

Graphene monolayers may then be deposited onto the Au layer 203' in each window 307 and the graphene monolayers may extend over an edge of the Au layer 203' and contact the doped silicon substrate 202'. The graphene monolayers may be produced by various techniques, such as exfoliation, sonication, corrosion in molten salts, electrochemical synthesis, hydrothermal self-assembly, chemical vapor deposition, nanotube slicing, carbon dioxide reduction, spin coating, supersonic spray, laser, microwave-assisted oxidation, ion implantation, etc. In an implementation, a highly oriented pyrolytic graphite or, alternatively, natural graphite may be mechanically exfoliated to obtain graphene. Using natural graphite in the mechanical exfoliation method may allow for production of larger graphene monolayers.

Referring back to FIG. 2B, according to an implementation, a graphene monolayer, such as the graphene monolayer 201, may be deposited on the Au layer 203' and the doped silicon substrate 202', with one end area of the graphene monolayer 201 forming an Ohmic contact with the Au layer 203', and the other end area of the graphene monolayer 201 forming an Schottky barrier junction with the substrate 202', using either mechanical exfoliation or chemical vapor deposition. The graphene monolayer 201 deposited by the mechanical exfoliation may show less resistivity and higher mobility in comparison with a graphene monolayer that is deposited using a chemical vapor deposition method.

EXAMPLE

In this example, a graphene-Si Schottky detector was fabricated, according to one implementation of the present disclosure. A p-type doped silicon substrate with a resistivity of 1-10Ω cm which is equivalent of a doping density of $1\times10^{16}$ cm$^{-3}$ was sliced using a wafer slicing device in a 1.2 cm×1.2 cm slice. The sliced silicon substrate was then cleaned by a cleaning process that involves subjecting the sliced silicon substrate to ultrasonication at room temperature for 15 minutes and then immersing the sliced silicon substrate in a propanol solution for 10 minutes, followed by washing the sliced silicon substrate with deionized water and then drying the sliced silicon substrate using nitrogen gas. There are $SiO_2$ layers at both sides of the sliced silicon substrate, one of which must be removed. In order to remove, for example, the $SiO_2$ layer on a back surface of the sliced silicon substrate, a front surface of the sliced silicon substrate may be covered by a photoresist substance and then the sliced silicon substrate may be immersed inside a hydrofluoric acid solution for 5 minutes in order to remove the $SiO_2$ layer on the back surface of the sliced silicon substrate. After that, the sliced silicon substrate was cleaned by the cleaning process as described before. Next, an Al layer with a thickness of 200 nm was deposited on the back surface of the sliced silicon substrate by a chemical vapor deposition method. After deposition of the Al layer on the back surface of the sliced silicon substrate, a rapid thermal processing was carried out on the substrate to ensure the establishment of an Ohmic contact between the Al layer and the silicon substrate. To this end, the sliced silicon substrate was heated at a temperature of approximately 450° C. for 5 minutes.

In a next step, a Ti layer with a thickness of approximately 10 nm was deposited by a chemical vapor deposition method on the front surface of the sliced silicon substrate on the $SiO_2$ layer and then an Au layer with a thickness of 200 nm was deposited on a surface of the Ti layer by a chemical vapor deposition method. Referring to FIG. 3D, the arrangement of the layers at this stage is schematically represented, where the sliced silicon wafer is designated by reference numeral 301, the Al layer is designated by 304, the $SiO_2$ layer is designated by 302, the Ti layer is designated by 306, and the Au layer is designated by 305.

A photolithography process may be utilized to pattern the Au layer, the Ti layer, and the $SiO_2$ layer. An S1813 photoresist layer is first coated on a surface of the Au layer by a spin coating process at a speed of approximately 4000 rpm for 30 seconds followed by baking at a temperature of approximately 210° C. for 2 minutes. A mask with a desired geometrical pattern was utilized for carrying out the photolithography. A developing process was then applied to remove the excess photoresist layer and form a photoresist layer with the desired pattern on the Au layer. To this end, the layers were immersed in an Mf-319 aqueous solution for 20 to 30 seconds followed by washing with deionized water and drying with nitrogen gas. An etching process may be carried out to etch the desired pattern on the Au layer, the Ti layer, and the $SiO_2$ layer. An ion beam milling was utilized to create the desired pattern onto the Au layer, the Ti layer, and the $SiO_2$ layer. After that, the photoresist layer was removed from the surface of the now patterned Au layer.

Referring to FIG. 3E, the arrangement of the layers at this stage is schematically represented, where the sliced silicon wafer is designated by reference numeral 301, the Al layer is designated by 304, the patterned SiO2 layer is designated by 302, the patterned Ti layer is designated by 306, and the patterned Au layer is designated by 305.

Layers of graphene were formed by mechanical exfoliation of natural graphite on a top surface of the Au layer, where the layers of graphene extended over an edge of the Au layer and contacted the doped silicon substrate thereby forming a Schottky junction with the doped silicon substrate. A power source was then attached to the Au layer and the Al layer to complete the graphene-Si Schottky detector, which is referred to hereinafter as the fabricated graphene-Si Schottky detector.

Figure 4:
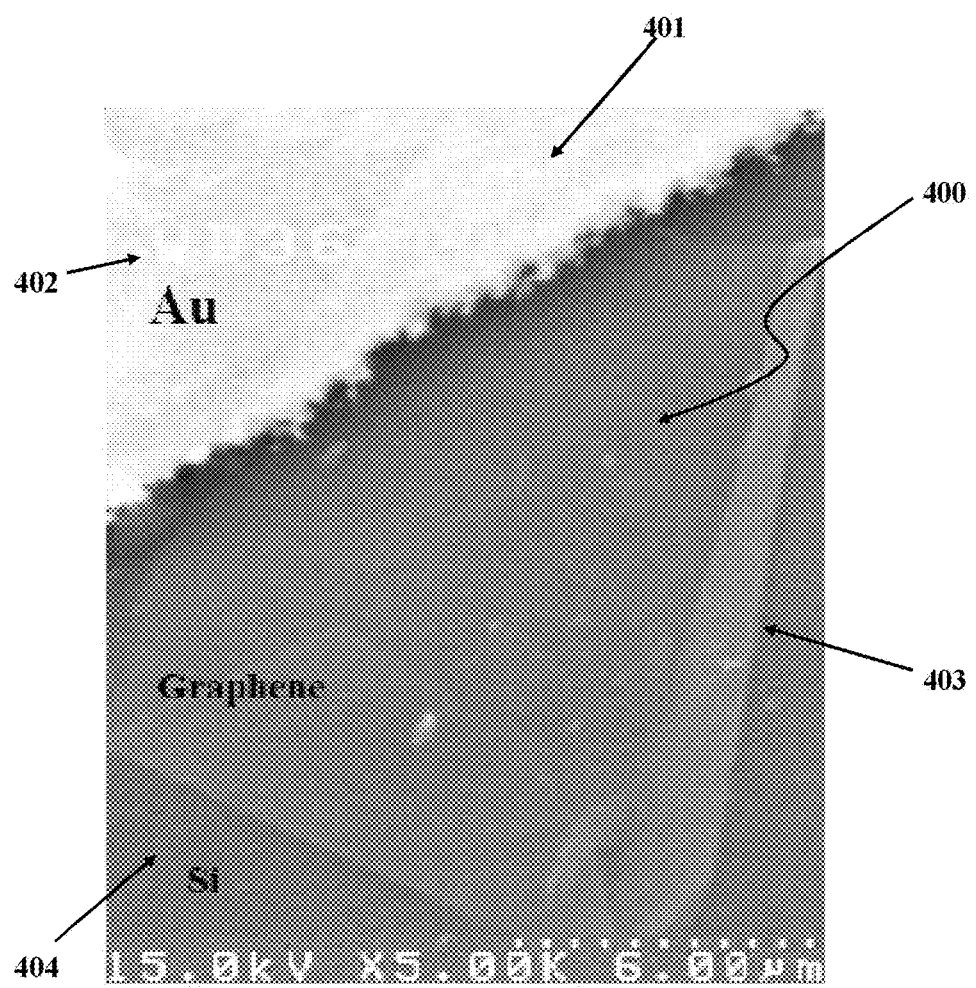
FIG. 4 illustrates a scanning electron microscope (SEM) image of a surface of the fabricated graphene-Si Schottky detector, according to an implementation of the present disclosure.

FIG. 4 illustrates a scanning electron microscope (SEM) image of a surface of the fabricated graphene-Si Schottky detector. Referring to FIG. 4, a first portion 401 of the graphene monolayer 400 is deposited onto the Au layer 402 that is similar to the Au layer 305 and a second portion 403 of the graphene monolayer 400 is deposited on the doped silicon substrate 404 which is similar to the doped silicon substrate 301. A Schottky junction is formed between the mechanically exfoliated graphite (graphene monolayer 400) and the doped silicon substrate 404.

Figure 5:
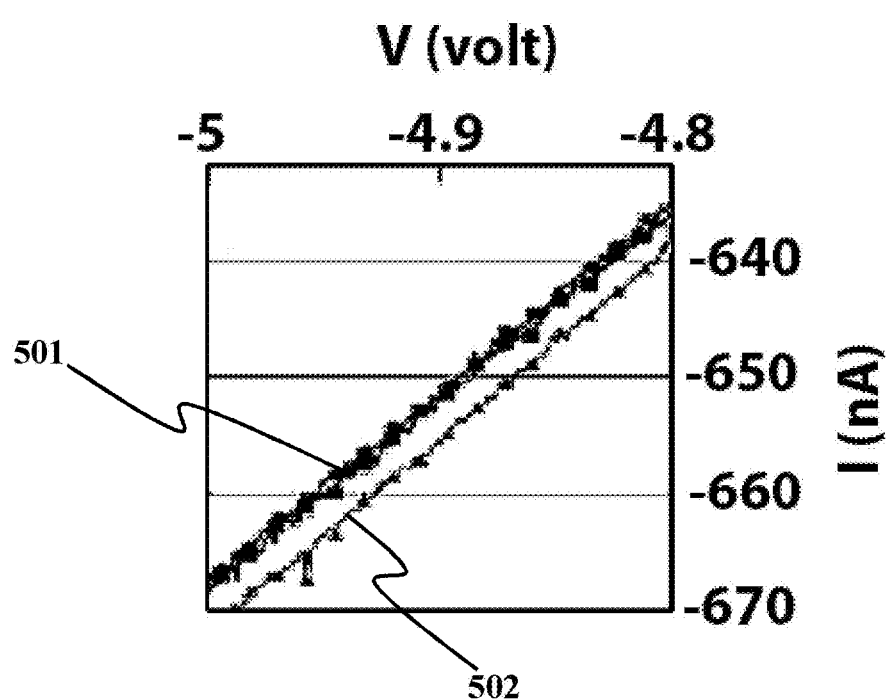
FIG. 5 illustrates a current-voltage (I-V) characteristic curve of a graphene-Si Schottky detector, according to one implementation of the present disclosure.

In order to show that the fabricated graphene-Si Schottky detector is sensitive to W-band radiations, the fabricated graphene-Si Schottky detector was placed in front of a W-band radiation source, which was a Gunn diode capable of producing 86 GHz radiations. In preparing a current-voltage characteristic curve of the fabricated graphene-Si Schottky detector, a source measure unit (SMU) was utilized. FIG. 5 illustrates current-voltage (I-V) characteristic curve of the fabricated graphene-Si Schottky detector, which was obtained by an I-V characterizing test conducted by the SMU. In a first run of the I-V- characterizing test, the fabricated graphene-Si Schottky detector was not exposed to any radiations. I-V curve 501 represents the I-V curve of the first run. In a second run, the fabricated graphene-Si Schottky detector was exposed to an 86 GHz radiation, and I-V curve 502 represents the I-V curve of the second run. As can be seen in FIG. 5, the I-V curve of the fabricated graphene-Si Schottky detector changes from the I-V curve 501 to I-V curve 502 once the detector is exposed to radiation. This means that the fabricated graphene-Si Schottky detector is capable of detecting W-band radiations.

Figure 6:
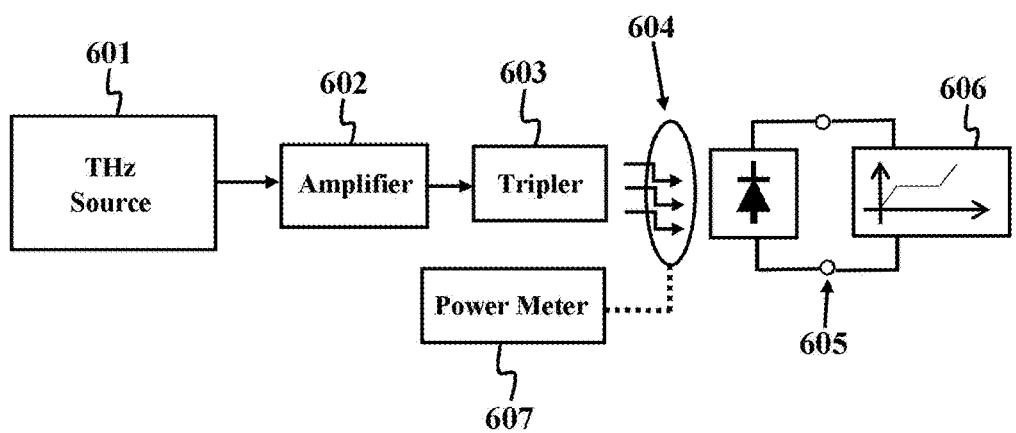
FIG. 6 illustrates a setup for evaluating sensitivity of the fabricated graphene-Si Schottky detector to THz radiations, according to one exemplary implementation of the present disclosure.
Figure 7:
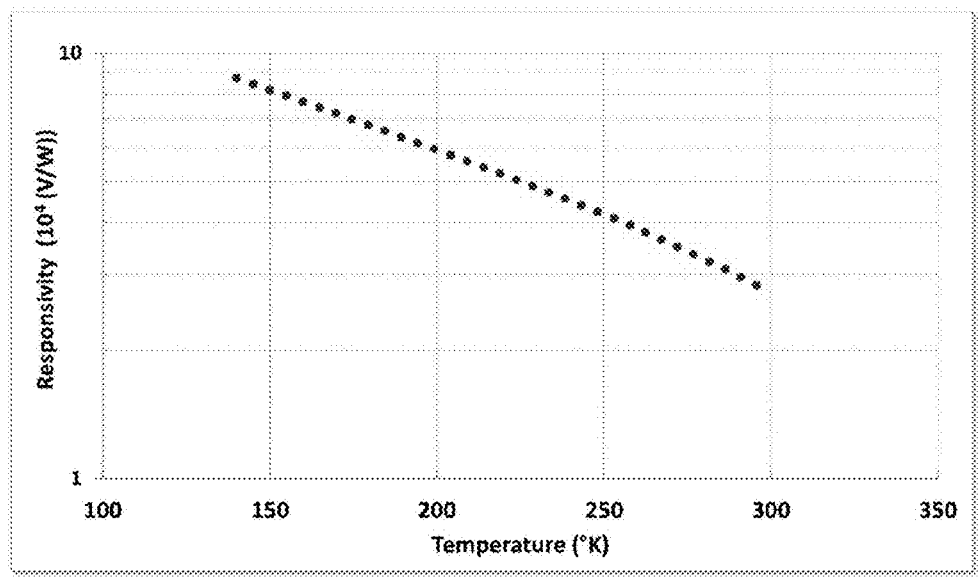
FIG. 7 illustrates calculated responsivity at different temperatures.

In order to show that the fabricated graphene-Si Schottky detector is sensitive to terahertz (THz) radiations and calculate the responsivity, the fabricated graphene-Si Schottky detector was placed in front of a THz radiation source. FIG. 6 illustrates a setup for evaluating sensitivity of the fabricated graphene-Si Schottky detector to THz radiations, according to one exemplary implementation of the present disclosure. The THz source 601 was an Agilent signal generator that was capable of producing a 34.2 GHz signal which was amplified using an amplifier 602 and then converted to 0.102 THz radiation 604 using a standard frequency Tripler 603. Biased at a given current, the output voltage 605 of Graphene-Si Schottky diode was measured using a measurement instrument 606 similar to measurement instrument 214 of FIG. 2B. The measurement instrument 606 measured the output voltage (V) 605 of the diode in a first state when the diode was not exposed to any radiations ($V_1$) and a second state when the diode was exposed to 0.102 THz radiations ($V_2$). The power (P) of the THz source 601 was also measured using a power meter 607. The responsivity was calculated using $R=(V_2-V_1)/P$. The responsivity of the detector was also measured and calculated at cryogenic temperatures down to 150° K. FIG. 7 illustrates calculated responsivity at different temperatures. Referring to FIG. 7, the fabricated graphene-Si Schottky detector can work at cryogenic temperatures down to 150° K and its responsivity increases by almost 1 order of magnitude. A processing unit similar to the processing unit 215 in FIG. 2B calculates the intensity of the incident radiations and displays on an output device similar to the output device 216 in FIG. 2B.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 201, 202, or 203 of the Patent Act, nor should they be interpreted in such a way. Any unintended embracing of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study, except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for detecting W-band and terahertz radiations, the method comprising:
   providing a graphene-Si Schottky diode that includes a graphene monolayer that at one end area is in Ohmic contact with an upper surface of an electrode above and insulated from a top surface of a doped silicon substrate, and that extends over an edge of the electrode to another end area that contacts the top surface in a manner forming a Schottky junction;
   storing reference current-voltage (I-V) characteristics of the Schottky junction in a reverse biased mode;
   measuring an I-V characteristic of the Schottky junction in the reverse biased mode;
   comparing a result of the measuring to the stored reference I-V characteristic; and
   based on a result of the comparing, detecting W-band and terahertz radiation.

2. The method of claim 1 for detecting W-band and terahertz radiations, the method further including:
   measuring I-V characteristics of the Schottky junction in the reverse biased mode when the Schottky junction is not exposed to any W-band and terahertz radiations, and
   wherein storing reference I-V characteristics of the Schottky junction includes storing a result of the measuring I-V characteristics of the Schottky junction when the Schottky junction is not exposed to any W-band and terahertz radiations.

3. The method of claim 1 for detecting W-band and terahertz radiations, wherein:
   the top surface includes a first region and a second region,
   the electrode is supported on an insulating layer disposed on the first region, and
   the another end area of the graphene monolayer contacts and forms a Schottky junction on the second region of the top surface.

4. The method of claim 3 for detecting W-band and terahertz radiations, wherein:

the electrode is a source electrode,
the substrate further forms a bottom surface that is opposite from and faces away from the top surface,
providing the graphene-Si Schottky diode further includes a drain electrode disposed on the bottom surface of the substrate.

5. The method of claim 4 for detecting W-band and terahertz radiations, wherein:
the source electrode includes an Au layer.

6. The method of claim 4 for detecting W-band and terahertz radiations, wherein:
the drain electrode includes an Al layer.

7. The method of claim 4 for detecting W-band and terahertz radiations, wherein measuring I-V characteristics of the Schottky junction includes:
applying at least one voltage between the source electrode and the drain electrode, including coupling a power source with the source electrode and the drain electrode; and
measuring a current generated between the source electrode and the drain electrode for the at least one voltage.

8. The method of claim 1 for detecting W-band and terahertz radiations, wherein detecting W-band and terahertz radiation includes detecting I-V characteristics of the Schottky junction being different from the reference I-V characteristics of the Schottky junction.

9. The method of claim 1 for detecting W-band and terahertz radiations, wherein:
the substrate includes a p-type silicon with a resistivity of 1-10Ω cm.

10. The method of claim 1 for detecting W-band and terahertz radiations, wherein
the electrode is supported on an insulating layer that is disposed on the first region, and
the insulating layer includes a SiO$_2$ layer.

11. A system for detecting W-band and terahertz radiations, the system comprising:
a graphene-Si Schottky diode associated with a source electrode and a drain electrode;
a power source coupled with the source electrode and the drain electrode and configured to apply a reference voltage between the source electrode and the drain electrode;
a measurement instrument configured to measure a generated current between the source electrode and the drain electrode; and
a processing unit configured to compare the measured generated current with a reference current, and to detect the W-band and terahertz radiations based on the comparison.

12. The system of claim 11 for detecting W-band and terahertz radiations, wherein:
the graphene-Si Schottky diode includes a doped silicon substrate, forming a top surface and, opposite from and facing away from the top surface, a bottom surface,
the source electrode is arranged above and insulated from the top surface, and
the drain electrode is disposed on the bottom surface.

13. The system of claim 12 for detecting W-band and terahertz radiations, wherein the graphene-Si Schottky diode further includes:
a graphene monolayer that at one end area is in Ohmic contact with an upper surface of the source electrode and that extends over an edge of the source electrode to another end area that contacts the top surface in a manner forming a Schottky junction.

14. The system of claim 13 for detecting W-band and terahertz radiations, wherein:
the top surface includes a first region and a second region,
the source electrode is supported on an insulating layer disposed on the first region, and
the another end area of the graphene monolayer contacts and forms a Schottky junction on the second region of the top surface.

15. The system of claim 13 for detecting W-band and terahertz radiations, wherein:
the source electrode includes an Au layer, and
the drain electrode includes an Al layer.

16. A system for detecting W-band and terahertz radiations, the system comprising:
a graphene-Si Schottky diode associated with a source electrode and a drain electrode;
a power source coupled with the source electrode and the drain electrode and configured to apply a reference current between the source electrode and the drain electrode;
a measurement instrument configured to measure, during the applying the reference current, a resulting voltage between the source electrode and the drain electrode; and
a processing unit configured to compare the resulting voltage measurement to a reference voltage, and to detect the W-band and terahertz radiations based on the comparison.

17. The system of claim 16 for detecting W-band and terahertz radiations, wherein:
the graphene-Si Schottky diode includes a doped silicon substrate, forming a top surface and, opposite from and facing away from the top surface, a bottom surface,
the source electrode is arranged above and insulated from the top surface, and
the drain electrode is disposed on the bottom surface.

18. The system of claim 17 for detecting W-band and terahertz radiations, wherein
the graphene-Si Schottky diode further includes:
a graphene monolayer that at one end area is in Ohmic contact with an upper surface of the source electrode and that extends over an edge of the source electrode to another end area that contacts the top surface in a manner forming a Schottky junction.

19. The system of claim 18 for detecting W-band and terahertz radiations, wherein:
the top surface includes a first region and a second region,
the source electrode is supported on an insulating layer disposed on the first region, and
the another end area of the graphene monolayer contacts and forms a Schottky junction on the second region of the top surface.

* * * * *